(12) United States Patent
Yamamoto et al.

(10) Patent No.: US 10,685,928 B2
(45) Date of Patent: Jun. 16, 2020

(54) CIRCUIT DEVICE, OSCILLATOR, ELECTRONIC APPARATUS, AND MOVING OBJECT

(71) Applicant: Seiko Epson Corporation, Tokyo (JP)

(72) Inventors: Takehiro Yamamoto, Matsumoto (JP); Masayuki Ishikawa, Suwa (JP)

(73) Assignee: Seiko Epson Corporation (JP)

( * ) Notice: Subject to any disclaimer, the term of this patent is extended or adjusted under 35 U.S.C. 154(b) by 161 days.

(21) Appl. No.: 15/726,812

(22) Filed: Oct. 6, 2017

(65) Prior Publication Data
US 2018/0108627 A1    Apr. 19, 2018

(30) Foreign Application Priority Data

Oct. 13, 2016  (JP) ................................ 2016-201489

(51) Int. Cl.
| | | |
|---|---|---|
| H01L 27/02 | (2006.01) | |
| H03B 5/04 | (2006.01) | |
| H03B 5/36 | (2006.01) | |
| H03L 1/02 | (2006.01) | |
| H01L 23/00 | (2006.01) | |
| H01L 23/31 | (2006.01) | |

(52) U.S. Cl.
CPC .......... *H01L 24/06* (2013.01); *H01L 23/3114* (2013.01); *H01L 27/0251* (2013.01); *H03B 5/04* (2013.01); *H03B 5/362* (2013.01); *H03B 5/364* (2013.01); *H03B 5/368* (2013.01); *H03L 1/028* (2013.01); *H01L 27/0296* (2013.01); *H01L 2224/0401* (2013.01); *H01L 2924/30205* (2013.01)

(58) Field of Classification Search
CPC . H01L 24/06; H01L 27/0248; H01L 27/0251; H01L 27/0296; H01L 2224/04; H01L 2224/0401; H01L 2924/30205; H03B 5/04; H03B 5/30; H03B 5/32; H03B 5/36; H03B 5/362; H03B 5/364; H03B 5/368; H03L 1/02; H03L 1/022; H03L 1/023; H03L 1/025–1/028
USPC .................................................. 331/154, 158
See application file for complete search history.

(56) References Cited

U.S. PATENT DOCUMENTS 5,706,156 A * 1/1998 Narita ................. H01L 27/0251
361/111
5,721,656 A * 2/1998 Wu ..................... H01L 27/0251
257/355

(Continued)

FOREIGN PATENT DOCUMENTS

| JP | 2006-054269 A | 2/2006 |
|---|---|---|
| JP | 2015-090973 A | 5/2015 |

(Continued)

*Primary Examiner* — Levi Gannon
(74) *Attorney, Agent, or Firm* — Harness, Dickey & Pierce, P.L.C.

(57) ABSTRACT

A circuit device includes a first pad and a second pad that are disposed in a first pad disposition region along a first side; a third pad and a fourth pad that are disposed in a second pad disposition region along a second side which faces the first side; and a first to fourth electrostatic protection circuits that are disposed in a circuit disposition region between the first pad disposition region and the second pad disposition region and are connected to the first to fourth pads.

16 Claims, 10 Drawing Sheets

(56) References Cited

U.S. PATENT DOCUMENTS

| | | | | |
|---|---|---|---|---|
| 5,875,086 | A * | 2/1999 | Narita | H01L 27/0251 |
| | | | | 361/111 |
| 6,104,588 | A * | 8/2000 | Hariton | H01L 27/0251 |
| | | | | 361/111 |
| 6,573,567 | B1 * | 6/2003 | Nishizawa | G06K 19/07 |
| | | | | 257/358 |
| 9,484,857 | B2 | 11/2016 | Itasaka et al. | |
| 9,484,926 | B2 | 11/2016 | Yamamoto | |
| 9,634,672 | B2 | 4/2017 | Yamamoto | |
| 2001/0015676 | A1 * | 8/2001 | Takikawa | H01L 23/66 |
| | | | | 330/307 |
| 2003/0058057 | A1 * | 3/2003 | Schmidt | H03L 1/00 |
| | | | | 331/175 |
| 2008/0197883 | A1 * | 8/2008 | Onishi | H01L 27/0251 |
| | | | | 326/82 |
| 2008/0201586 | A1 * | 8/2008 | Onishi | G06F 1/1632 |
| | | | | 713/300 |
| 2014/0071566 | A1 * | 3/2014 | Parthasarathy | H01L 23/62 |
| | | | | 361/56 |

FOREIGN PATENT DOCUMENTS

| | | |
|---|---|---|
| JP | 2016-134888 A | 7/2016 |
| JP | 2016-134889 A | 7/2016 |

\* cited by examiner

CIRCUIT DEVICE, OSCILLATOR, ELECTRONIC APPARATUS, AND MOVING OBJECT

BACKGROUND

1. Technical Field

The present invention relates to a circuit device, an oscillator, an electronic apparatus, and a moving object.

2. Related Art

A semiconductor chip of a circuit device is provided with pads for being connected to terminals, bumps (bumps for being directly mounted on a substrate), or the like of a package. For example, a plurality of pads are disposed in a pad disposition region along a side of the semiconductor chip. Various circuit blocks are connected to the pads and are disposed on a substrate of the semiconductor chip.

There is a method of, for example, JP-A-2006-54269 as a layout method of the circuit block. In JP-A-2006-54269, an AC block (an analog circuit block operating in an AC manner) and a DC block (an analog circuit block operating in a DC manner) are separately disposed, and thereby, a piezoelectric oscillator is prevented from malfunctioning due to interference between the AC block and the DC block.

In addition, there are a use for requiring high reliability and a use (hereinafter, referred to as consumer use) for not requiring the high reliability so far, as a use for a circuit device. For example, high reliability is required for an in-vehicle use from the viewpoint of safety and the like. Meanwhile, for example, a so-called household electronic device (for example, a portable information terminal and the like) does not generally require reliability as compared with the in-vehicle use.

There is reliability of pad bonding as one of the aforementioned reliability. For example, the reliability is certainty of inter-terminal connection in bonding, non-aggressiveness (no decrease in quality or no breakdown of a circuit device due to bonding) of bonding, or the like. Regarding the reliability, there are a case where high reliability is required for pad bonding, for example, for an in-vehicle use and the like, and a case where reliability is not required (for example, for consumer use) as compared with the case. There is a case where different pad sizes are required depending on the degree of reliability. However, if it is attempted to individually prepare a layout for a plurality of uses with different degrees of reliability which is required so as to cope with different pad sizes, there is a concern that cost increases and the design is complicated.

SUMMARY

An advantage of some aspects of the invention is to provide a circuit device, an oscillator, an electronic apparatus, and a moving object in which a layout change can be simplified in a case where high reliability is required for pad bonding, and in a case where reliability is not required as compared with the case.

The invention can be implemented as the following configurations.

An aspect of the invention relates to a circuit device including a first pad and a second pad that are disposed in a first pad disposition region along a first side; a third pad and a fourth pad that are disposed in a second pad disposition region along a second side of the circuit device which faces the first side; a first electrostatic protection circuit that is disposed in a circuit disposition region between the first pad disposition region and the second pad disposition region and is connected to the first pad; a second electrostatic protection circuit that is disposed in the circuit disposition region and is connected to the second pad; a third electrostatic protection circuit that is disposed in the circuit disposition region and is connected to the third pad; and a fourth electrostatic protection circuit that is disposed in the circuit disposition region and is connected to the fourth pad.

According to the aspect of the invention, in a case where high reliability is required for bonding pads, for example, for in-vehicle and the like, it is possible to adopt a layout (layout of a non-shrink version) in a state where the first pad disposition region and the second pad disposition region are left. Meanwhile, in a case where reliability is not relatively required for bonding the pads, it is possible to adopt a layout (layout of a shrink version) in which the first pad disposition region and the second pad disposition region are removed and the pads are disposed in a circuit disposition region (for example, on an electrostatic protection circuit). Thereby, it is possible to simplify a layout change in a case where high reliability is required for bonding the pads, and in a case where the reliability is not required as compared with the case.

In the aspect of the invention, a third side of the circuit device may intersect the first side and the second side, and a fourth side of the circuit device may face the third side, the first pad may be disposed in a first corner region where the first side intersects the third side, the second pad may be disposed in a second corner region where the first side intersects the fourth side, the third pad may be disposed in a third corner region where the second side intersects the third side, and the fourth pad may be disposed in a fourth corner region where the second side intersects the fourth side.

According to this configuration, by disposing first to fourth pads in first to fourth corner regions, a first pad disposition region becomes a region along a first side, a second pad disposition region becomes a region along a second side. Thereby, it is possible to realize a layout configuration in which the first pad disposition region and the second pad disposition region (that is, predetermined width portions above and below a semiconductor chip) can be removed, and to simplify switching between a shrink version and a non-shrink version.

In the aspect of the invention, the first pad and the first electrostatic protection circuit may be disposed so as to interpose a first boundary between the first pad disposition region and the circuit disposition region, the second pad and the second electrostatic protection circuit may be disposed so as to interpose the first boundary, the third pad and the third electrostatic protection circuit may be disposed so as to interpose a second boundary between the second pad disposition region and the circuit disposition region, and the fourth pad and the fourth electrostatic protection circuit may be disposed so as to interpose the second boundary.

According to this configuration, a pad and an electrostatic protection circuit are disposed so as to interpose a boundary between a pad disposition region and a circuit disposition region, and thereby, the pad disposition region and the circuit disposition region can be separated at the boundary (or around the boundary). Thereby, it is possible to remove a layout of the first pad disposition region and the second pad disposition region at the boundary (or around the boundary), and to simplify a layout creation of a shrink version.

In the aspect of the invention, the circuit device may further include an oscillation circuit that oscillates an oscillation piece; a clock signal output circuit that outputs a clock signal on the basis of an oscillation signal of the oscillation circuit; and a temperature compensation circuit that performs temperature compensation of an oscillation frequency of the oscillation circuit. The oscillation circuit, the clock signal output circuit, and the temperature compensation circuit may be disposed in the circuit disposition region.

According to the aspect of the invention, a circuit serving as a core of a circuit device of an oscillator is disposed in a circuit disposition region. In addition, as described above, an electrostatic protection circuit connected to pads disposed in a pad disposition region is provided in the circuit disposition region. Thereby, the pad disposition region is removed so as to leave the circuit disposition region, and the pads are provided in a disposition region where the electrostatic protection circuit is disposed, and thereby, it is possible to create a layout of a shrink version in a simple sequence.

In the aspect of the invention, the first pad may receive a low potential side power supply, the second pad may receive a control voltage of the oscillation frequency, the third pad may output the clock signal, and the fourth pad may receive a high potential side power supply.

By disposing pads in a first pad disposition region and a second pad disposition region, power supply can be supplied to, and signals are input and output to and from a circuit device of an oscillator. In a layout of a shrink version, the pads are provided in a disposition region of an electrostatic protection circuit, and thereby, the layout of a shrink version can be created in a simple sequence.

In the aspect of the invention, the circuit device may further include a fifth pad that is disposed between the first pad and the second pad, in the first pad disposition region; and a sixth pad that is disposed between the third pad and the fourth pad, in the second pad disposition region. The fifth pad may be connected to one terminal of the oscillation piece, and the sixth pad may be connected to the other terminal of the oscillation piece.

By disposing the pads in the first pad disposition region and the second pad disposition region, an oscillation piece can be connected to an oscillation circuit of a circuit device, and thereby, the oscillation circuit can oscillate the oscillation piece. An oscillator can be configured by placing the circuit device and the oscillation piece in a package.

In the aspect of the invention, the circuit device may further include a fifth electrostatic protection circuit that is connected to the fifth pad, and the fifth electrostatic protection circuit may be disposed in the first pad disposition region.

According to the aspect of the invention with this configuration, a fifth pad and a fifth electrostatic protection circuit connected thereto are disposed in a first pad disposition region. Thereby, the fifth pad and the fifth electrostatic protection circuit can be closely disposed, and the fifth electrostatic protection circuit functions appropriately.

In the aspect of the invention, the circuit device may further include a nonvolatile memory that stores parameter information for temperature compensation of the oscillation frequency. When a direction from the first side toward the second side is referred to as a first direction, the nonvolatile memory may be disposed in the first direction of the fifth pad.

In a case of the disposition, a fifth electrostatic protection circuit cannot be provided between a fifth pad and a nonvolatile memory (there is no space to be provided). Accordingly, the fifth electrostatic protection circuit is disposed, for example, in a first direction of the nonvolatile memory, in a layout of a shrink version. However, in a case of a layout of a non-shrink version, the fifth pad and the fifth electrostatic protection circuit are separated so as to interpose the nonvolatile memory, and thereby, there is a possibility that an electrostatic protection function decreases. Therefore, in the aspect of the invention, the fifth electrostatic protection circuit is disposed in a first pad disposition region in the layout of a non-shrink version. Thereby, the fifth electrostatic protection circuit functions appropriately.

In the aspect of the invention, the oscillation circuit may be disposed in a region between the first electrostatic protection circuit and the third electrostatic protection circuit.

An oscillation circuit that generates an AC signal (alternate current signal) can affect a temperature compensation circuit which operates in a DC (direct current) manner. Accordingly, it is desirable that the oscillation circuit and the temperature compensation circuit are disposed at positions separated from each other in a circuit disposition region. According to the aspect of the invention, the oscillation circuit is disposed between first and third electrostatic protection circuits disposed in corner regions of a circuit disposition region, and thereby, it is possible to secure a distance between the temperature compensation circuit and the oscillation circuit.

In the aspect of the invention, an inter-power supply capacitor that is provided between a high potential power supply and a low potential power supply may be disposed in at least one pad disposition region of the first pad disposition region and the second pad disposition region.

According to this configuration, an inter-power supply capacitor is disposed in a pad disposition region, and thereby, it is possible to effectively utilize an empty region (region between a pad and a pad) of a pad disposition region. In addition, by providing the inter-power supply capacitor in a semiconductor chip, influences of a connection resistance of the pad (terminal) and inductance of a wire can be reduced as much as possible. Thereby, it is possible to improve characteristics (for example, performance of temperature compensation) of an oscillator.

In the aspect of the invention, each of the first to fourth electrostatic protection circuits may be disposed in a disposition region having a size where a pad is disposed.

With this configuration, it is possible to dispose pads in a disposition region where first to fourth electrostatic protection circuits are disposed, and to connect pads to the electrostatic protection circuit provided under the pads. Thereby, when layout data of a shrink version is generated, a pad region need not be newly secured, and a layout change of a circuit disposition region can be minimized, and thus, it is possible to create the layout of a shrink version.

In the aspect of the invention, an area of the first pad may be wider than an area of the disposition region of the first electrostatic protection circuit, an area of the second pad may be wider than an area of the disposition region of the second electrostatic protection circuit, an area of the third pad may be wider than an area of the disposition region of the third electrostatic protection circuit, and an area of the fourth pad may be wider than an area of the disposition region of the fourth electrostatic protection circuit.

With this configuration, it is possible to use a pad with an area wider than an area of a pad in a layout of a shrink version, in the non-shrink version layout. Thereby, it is possible to improve reliability of bonding in a circuit device adopting the layout of a non-shrink version.

In the aspect of the invention, the first to fourth pads may be disposed in corner regions of the circuit device, and the first to fourth electrostatic protection circuits may be disposed in corner regions of the circuit disposition region.

With this configuration, a pad and an electrostatic protection circuit connected to the pad are disposed in proximity (adjacent) to each other. In a case where a wire connecting the pad to the electrostatic protection circuit is long, there is a possibility that an electrostatic protection function decreases due to resistance and the like, but according to the aspect of the invention, it is possible to prevent the electrostatic protection function from decreasing.

Another aspect of the invention relates to an oscillator including the circuit device described above, and an oscillation piece.

Still another aspect of the invention relates to an electronic apparatus including the circuit device described above.

Still another aspect of the invention relates to a moving object including the circuit device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. The present embodiment described below does not unduly limit contents of the invention described in the appended claims, and all the configurations described in the present embodiment are not indispensable as means for solving the invention.

1. Circuit Device

Figure 1:
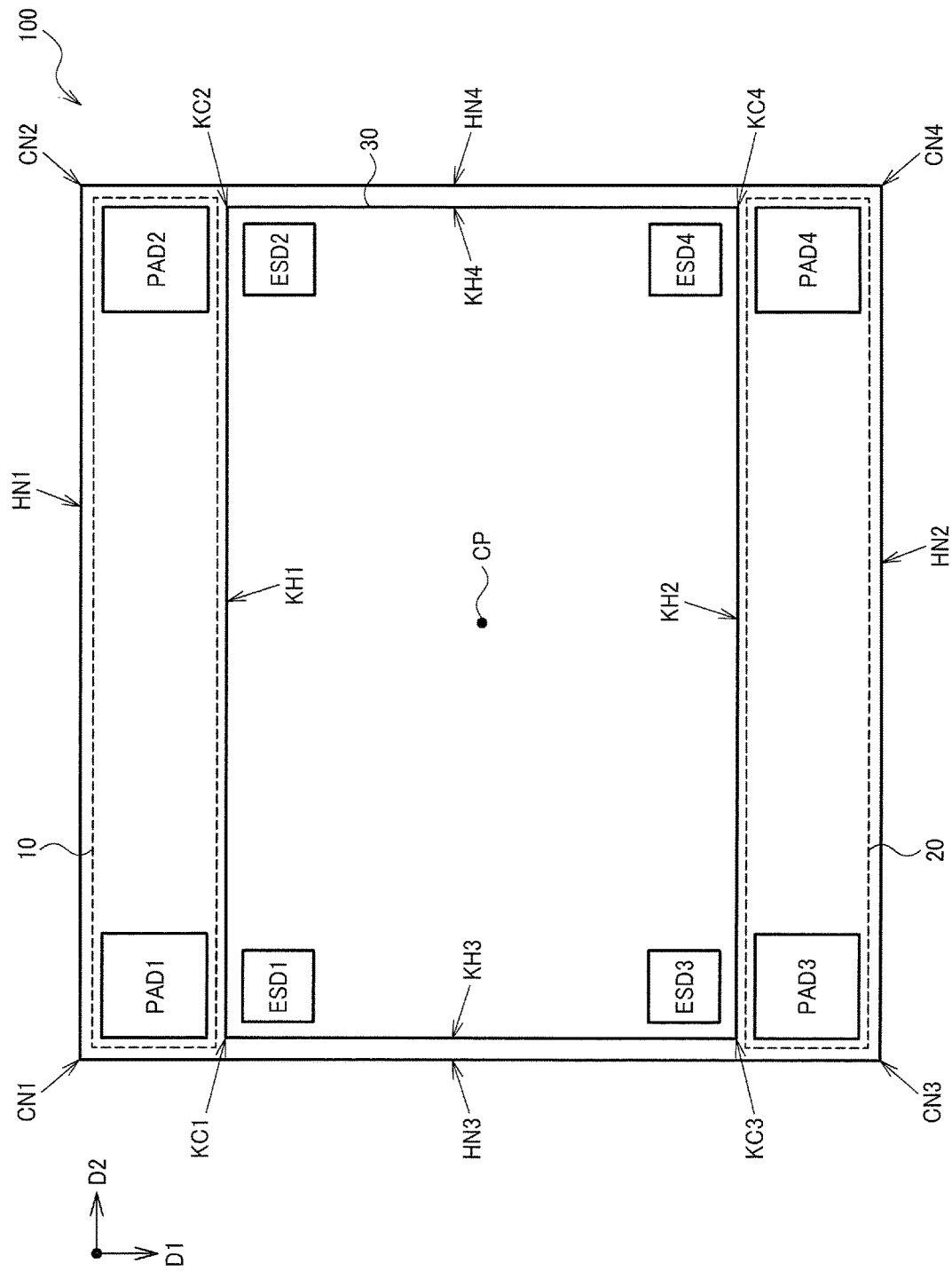
FIG. 1 is a layout configuration example of a circuit device according to a present embodiment.

FIG. 1 illustrates an example of a layout configuration example of a circuit device 100 according to the present embodiment. The circuit device 100 includes first to fourth pads, and first to fourth electrostatic protection circuits. The circuit device 100 is an integrated circuit device, and FIG. 1 is a plan view of a semiconductor chip (a silicon substrate in which a circuit is formed) of the integrated circuit device. The present embodiment is not limited to the configuration of FIG. 1, and various modifications such as omitting apart of configuration elements thereof and adding other configuration elements can be made.

The first pad (PAD1) and the second pad (PAD2) are disposed in a first pad disposition region 10 along a first side HN1 of the circuit device 100 (semiconductor chip). The third pad (PAD3) and the fourth pad (PAD4) are disposed in a second pad disposition region 20 along a second side HN2 of the circuit device 100. The second side HN2 faces the first side HN1. For example, in a case where the circuit device 100 is a rectangle or a square, the second side HN2 is parallel (including substantially parallel) to the first side HN1.

Specifically, the pad is a terminal for electrically connecting a circuit in the semiconductor chip to a circuit (or terminal) outside the semiconductor chip. The first pad, the second pad, the third pad, and the fourth pad are respectively formed in a first pad region PAD1, a second pad region PAD2, a third pad region PAD3, and a fourth pad region PAD4. The pad region is a region of a portion of a metal layer (for example, an uppermost metal layer) exposed from a passivation film (insulating layer). The pad is formed by the exposed metal layer.

The pad is disposed in the pad disposition region. The pads are not required to be adjacent to each other in the pad disposition region, and there may be a gap between the pad and the pad. A region including (surrounding) the plurality of pads is the pad disposition region. The first pad disposition region 10 is a rectangular region whose long side is in a direction along the first side HN1 and whose short side is in a direction along the third side HN3 (or the fourth side HN4). For example, the first pad disposition region 10 is the smallest rectangular region out of rectangles including the pad regions PAD 1 and PAD 2. The pad and a circuit element are not disposed between the first pad disposition region 10 and the first side HN1. The second pad disposition region 20 is a rectangular region whose long side is in a direction along the second side HN2 and whose short side is in a direction along the third side HN3 (or the fourth side HN4). For example, second pad disposition region 20 is the smallest rectangular region out of rectangles including the pad regions PAD3 and PAD4. The pad and the circuit element are not disposed between the second pad disposition region 20 and the second side HN2.

Here, the first to fourth sides HN1 to HN4 of the circuit device 100 are sides of a semiconductor chip (silicon substrate). The third side HN3 and the fourth side HN4 are sides crossing (for example orthogonal to) the first side HN1 and the second side HN2. In a case where the fourth side HN4 is a side which faces the third side HN3, for example, the circuit device 100 is a rectangle or a square, the fourth side HN4 is parallel (including substantially parallel) to the third side HN3.

In addition, in the present embodiment, first to fourth electrostatic protection circuits ESD1 to ESD4 are disposed in a circuit disposition region 30. The first electrostatic protection circuit, the second electrostatic protection circuit, the third electrostatic protection circuit, and the fourth electrostatic protection circuit are respectively connected to the first pad, the second pad, the third pad, and the fourth pad (for example, electrically connected by wires). The circuit disposition region 30 is disposed between the first pad disposition region 10 and the second pad disposition region 20.

Specifically, the first electrostatic protection circuit, the second electrostatic protection circuit, the third electrostatic protection circuit, and the fourth electrostatic protection circuit are respectively disposed in the first disposition region ESD1, the second disposition region ESD2, the third disposition region ESD3, and the fourth disposition region ESD4. As will be described below, the disposition region is a region where the electrostatic protection circuit is disposed, and is a region where a size in which the pad can be disposed is secured. For example, the disposition region is a smallest square (or rectangular) region where pads having a size determined by a design rule can be disposed. The electrostatic protection circuit protects an element and a circuit in the circuit device 100 from an overvoltage or an overcurrent applied to the pad (terminal of IC). For example, the electrostatic protection circuit can be configured with a diode, a transistor (for example, a diode-connected transistor) or the like connected between the pad and a power supply.

A circuit serving as a core of the circuit device 100 is disposed in the circuit disposition region 30. The circuit serving as a core realizes a function of the circuit device 100. For example, the circuit serving as a core is a circuit that processes a signal which is input and output by the circuit device 100, a circuit that generates a signal which is output from the circuit device, and the like. For example, in a case where the circuit device 100 controls an oscillator such as a temperature compensated crystal oscillator (TCXO), an oscillation circuit, a clock signal output circuit, a temperature compensation circuit, a bias circuit, a memory, or the like corresponds to the circuit serving as a core. For example, all the regions other than the first pad disposition region 10 and the second pad disposition region 20 in the semiconductor chip are the circuit disposition region 30. Alternatively, the smallest rectangle or square among rectangles or squares including the circuit serving as a core of the circuit device 100 is the circuit disposition region 30.

Here, a region where circuits (the circuit serving as a core, the electrostatic protection circuit) are disposed is a region where configuration elements of the circuit are disposed. That is, the region is a region where circuit elements configure the circuit, wires connecting between the elements, a guard bar (a structure for protecting the circuit from noise and the like by connecting a diffusion region provided around the circuit to a power supply or the like), and the like are disposed. The circuit element is, for example, a transistor, a resistor, a capacitor or the like. Polysilicon, a diffusion layer, and a metal layer which form those are disposed in the region.

According to the present embodiment described above, the first to fourth electrostatic protection circuits ESD1 to ESD4 are disposed in the circuit disposition region 30 between the first pad disposition region 10 and the second pad disposition region 20.

In this way, in a case where high reliability is required for bonding the pad as in an in-vehicle use or the like, a non-shrink version layout illustrated in FIG. 1 can be adopted. Meanwhile, in a case where reliability is not relatively required, it is possible to adopt a shrink version layout in which the circuit disposition region 30 is cut out (the first pad disposition region 10 and the second pad disposition region 20 are removed). Thereby, it is possible to simplify a layout change in the above two cases. Hereinafter, more specific description will be made with reference to FIG. 2.

Figure 2:
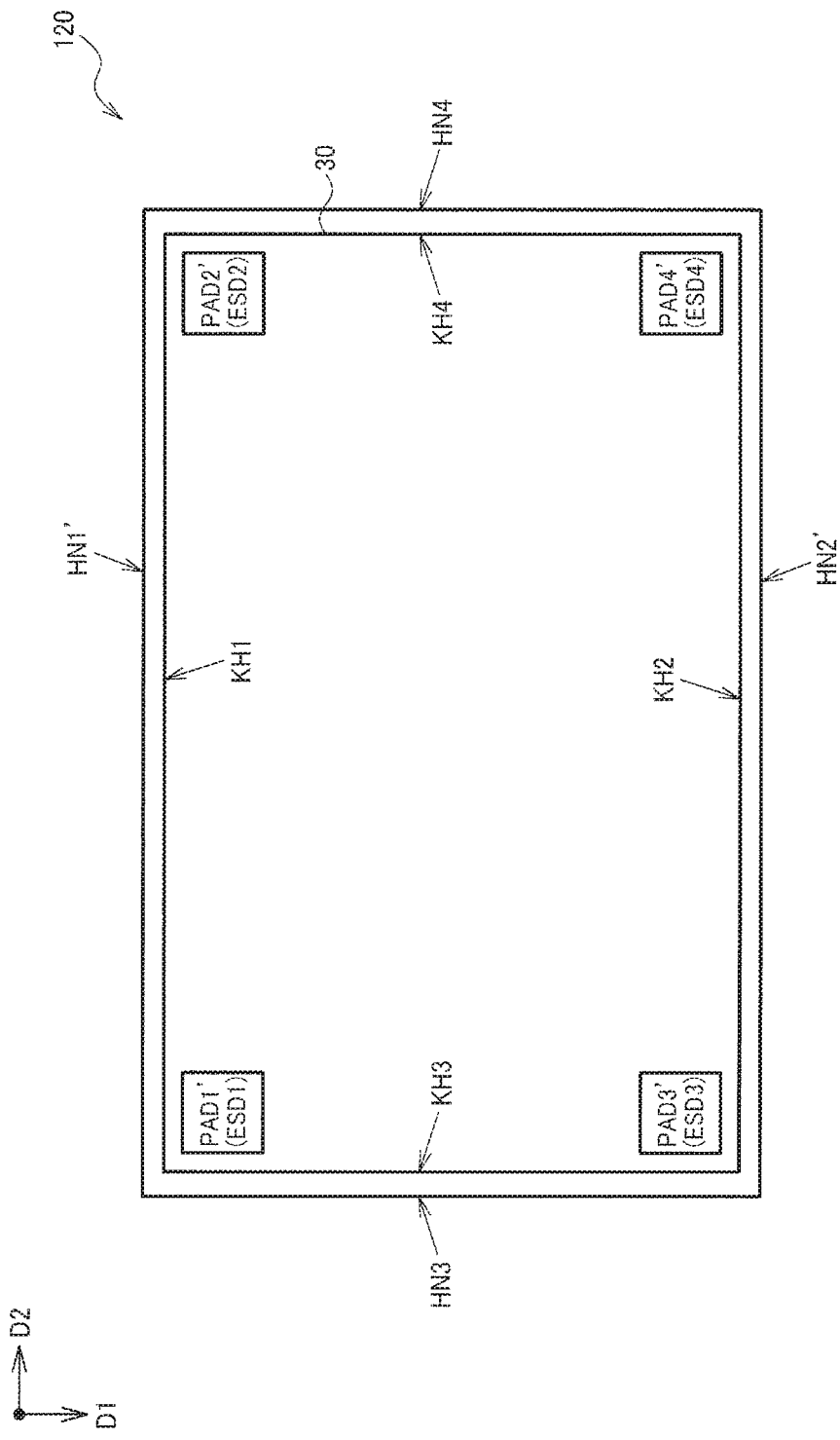
FIG. 2 is a layout configuration example of a circuit device of a shrink version.

FIG. 2 illustrates a layout configuration example of a circuit device 120 of a shrink version. FIG. 2 illustrates pads respectively disposed in pad regions PAD1', PAD2', PAD3', and PAD4'. The pad regions PAD1', PAD2', PAD3', and PAD4' respectively correspond to the disposition regions ESD1, ESD2, ESD3, and ESD4 in FIG. 1. That is, the electrostatic protection circuit is provided under the pad, and the pad is connected to the electrostatic protection circuit provided under the pad.

In FIG. 2, the first pad disposition region 10 is not provided between a first side HN1' of the circuit device 120 and a side KH1 of the circuit disposition region 30. The side KH1 is adjacent to the first pad disposition region 10 in FIG. 1. For example, the first side HN1' corresponds to a straight line between the side KH1 of the circuit disposition region 30 and the first pad disposition region 10 in FIG. 1 or corresponds to the side KH1 itself of the circuit disposition region 30. In the same manner, in FIG. 2, the second pad disposition region 20 is not provided between a second side HN2' of the circuit device 120 and the side KH2 of the circuit disposition region 30. The side KH2 is adjacent to the second pad disposition region 20 in FIG. 1. For example, the second side HN2' corresponds to a straight line between the side KH2 of the circuit disposition region 30 and the second pad disposition region 20 in FIG. 1 or corresponds to the side KH2 itself of the circuit disposition region 30. Sides KH3 and KH4 of the circuit disposition region 30 are side (or the sides that coincide with the third side HN3 and the fourth side HN4) corresponding to sides adjacent to the third side HN3 and the fourth side HN4 of the circuit device 100.

As such, in the circuit device 120 of a shrink version, a size of the semiconductor chip is reduced to a size corresponding to the circuit disposition region 30, and the pad is provided in a disposition region of the electrostatic protection circuit. In a case where reliability is not relatively required for bonding the pad, it is possible to reduce cost by adopting the shrink version. Meanwhile, in a case where high reliability is required for bonding the pad, the electrostatic protection circuit is provided in a region different from the pad by adopting a non-shrink version as illustrated in FIG. 1, and reliability of electrostatic protection can be improved. That is, it is possible to reduce an influence of stress and the like due to the bonding on the electrostatic protection circuit. In addition, it is possible to adopt different pad sizes or different pad structures from the pads of the shrink version. Thereby, it is possible to improve certainty of the bonding contact or to reduce the influence (for example, crack and the like) due to the bonding on the circuit device 100.

In the present embodiment, as illustrated in FIG. 1, the first pad PAD1, the second pad PAD2, the third pad PAD3, and the fourth pad PAD4 are respectively disposed in a region of a first corner CN1, a region of a second corner CN2, a region of a third corner CN3, and a region of a fourth corner CN4. The first side HN1 and the third side HN3 intersect at the first corner CN1. The first side HN1 and the fourth side HN4 intersect at the second corner CN2. The second side HN2 and the third side HN3 intersect at the third corner CN3. The second side HN2 and the fourth side HN4 intersect at the fourth corner CN4.

Specifically, the corner region is a region around (near) a corner. That is, the corner region is a region (for example, a rectangular or square region having a side having a predetermined width with respect to a corner) having a predetermined size including a corner where two sides intersect. For example, in a case where FIG. 1 is used as an example, the pad region PAD1 is disposed inside a region of the first corner CN 1. A distance from the first corner CN1 to the pad region PAD1 is shorter than a distance from the center CP (for example, a point of intersection of diagonal lines) of the circuit device 100 to the pad region PAD1. For example, the smallest rectangular or square region including the pad region PAD1 and the first corner CN1 is the corner region. More specifically, in the corner region, no circuit element is disposed between the side configuring the corner and the pad. For example, in the first pad, no circuit element is disposed between the pad region PAD1 and the first side HN1, and between the pad region PAD and the third side HN3. The circuit element here is, for example, a passive element or an active element, such as a resistor, a capacitor, or a transistor.

As such, by disposing the first to fourth pads in the first to fourth corner regions CN1 to CN4, the first pad disposition region 10 becomes a region along the first side HN1, and the second pad disposition region 20 becomes a region along the second side HN2. Thereby, it is possible to realize a layout configuration by which the first pad disposition region 10 and the second pad disposition region 20 (that is, predetermined width portions above and below the semiconductor chip) can be removed, and switching between the shrink version and the non-shrink version is simplified.

In addition, in the present embodiment, the first pad PAD1 and the first electrostatic protection circuit ESD1 are disposed so as to interpose a first boundary between the first pad disposition region 10 and the circuit disposition region 30. The second pad PAD2 and the second electrostatic protection circuit ESD2 are disposed so as to interpose the first boundary therebetween. The third pad PAD3 and the third electrostatic protection circuit ESD3 are disposed so as to interpose a second boundary between the second pad disposition region 20 and the circuit disposition region 30. The fourth pad PAD4 and the fourth electrostatic protection circuit ESD4 are disposed so as to interpose the second boundary therebetween.

Specifically, one side of the pad region (for example, PAD1) where the pad is disposed and one side of the disposition region (for example, ESD1) where the electrostatic protection circuit is disposed are disposed so as to face each other across the boundary. Here, the first boundary is a (virtual) straight line between the side KH1 of the circuit disposition region 30 and the first pad disposition region 10, or a side KH1 itself of the circuit disposition region 30. The side KH1 is a side along (parallel to) the first side HN1 of the circuit device 100. The second boundary is a (virtual) straight line between the side KH2 of the circuit disposition region 30 and the second pad disposition region 20, or the side KH2 itself of the circuit disposition region 30. The side KH2 is a side along (parallel to) the second side HN2 of the circuit device 100.

As such, the pad and the electrostatic protection circuit are disposed so as to interpose the boundary between the pad disposition regions 10 and 20 and the circuit disposition region 30, and thereby, the pad disposition regions 10 and 20 and the circuit disposition region 30 can be separated by the boundary (or vicinity of the boundary). Thereby, by removing the layout of the first pad disposition region 10 and the second pad disposition region 20 at the boundary (or in the vicinity of the boundary), a layout of the circuit device 120 of a shrink version can be created.

In addition, in the present embodiment, the first to fourth pads PAD1 to PAD4 are disposed in the corner regions CN1 to CN4 of the circuit device 100 and the first to fourth electrostatic protection circuits ESD1 to ESD4 are disposed in the corner region of the circuit disposition region 30.

Specifically, the first electrostatic protection circuit is disposed in a corner region KC1 where the side KH1 and the side KH3 of the circuit disposition region 30 intersect. The second electrostatic protection circuit is disposed in a corner region KC2 where the side KH1 and the side KH4 of the circuit disposition region 30 intersect. The third electrostatic protection circuit is disposed in a corner region KC3 where the side KH2 and the side KH3 of the circuit disposition region 30 intersect. The fourth electrostatic protection circuit is disposed in a corner region KC4 where the side KH2 and the side KH4 of the circuit disposition region 30 intersect.

By doing so, the pad and the electrostatic protection circuit connected to the pad are disposed in proximity (adjacent) to each other. For example, the corner KC1 of the circuit disposition region 30 in which the first electrostatic protection circuit ESD1 is disposed is closest to the corner KC1 of the circuit device 100 in which the first pad PAD1 is disposed, in the corner of the circuit disposition region 30. In a case where a wire connecting the pad to the electrostatic protection circuit is long, there is a possibility that the electrostatic protection function is decreased by the resistance and the like, but, according to the present embodiment, it is possible to prevent the electrostatic protection function from decreasing.

In addition, in the present embodiment, each of the first to fourth electrostatic protection circuits is disposed in a disposition region having a size where the pads can be disposed. That is, each of the disposition regions ESD1 to ESD4 where the first to fourth electrostatic protection circuits are disposed has a size in which pads can be disposed.

Specifically, the disposition region having the size where the pads can be disposed is a region having a size to be secured for disposing the pads, and is, for example, a region having a pad size specified in a design rule. The disposition region is a region secured for disposing the electrostatic protection circuit and is a region where circuit elements other than the electrostatic protection circuit are not disposed. That is, as illustrated in FIG. 3, the electrostatic protection circuit may be disposed only in a region of a part of the disposition region ESD (each of ESD1 to ESD4), and no circuit element is disposed inside the disposition region ESD other than a part of the region.

By doing so, the pads are disposed in the disposition regions ESD1 to ESD4 where the first to fourth electrostatic protection circuits are disposed, and thereby, the pads can be connected to the electrostatic protection circuits provided under the pads. Thereby, when layout data of the shrink version is generated, it is not necessary to newly secure the pad region, and the circuit device 120 of the shrink version can be manufactured by minimizing a layout change of the circuit disposition region 30.

In addition, in the present embodiment, an area of each of the first to fourth pads is wider than an area of each of the disposition regions ESD1 to ESD4 of the first to fourth electrostatic protection circuits. That is, the area of each of the pad regions PAD1 to PAD4 is wider than the area of each of the disposition regions ESD1 to ESD4. That is, the area of the first pad (pad region PAD1) is wider than the area of the disposition region ESD1 of the first electrostatic protection circuit, the area of the second pad (pad region PAD2) is wider than the area of the disposition region ESD2 of the second electrostatic protection circuit, the area of the third pad (pad region PAD3) is wider than the area of the disposition region ESD3 of the third electrostatic protection circuit, and the area of the fourth pad (pad region PAD4) is wider than the area of the disposition region ESD4 of the fourth electrostatic protection circuit.

Figure 3:
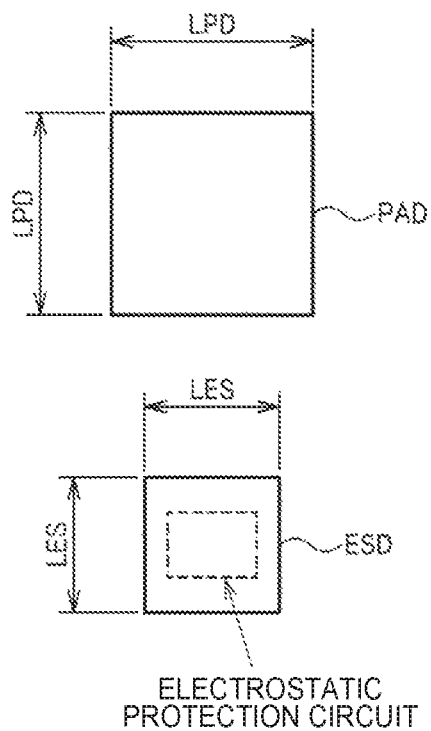
FIG. 3 is an example of a size in a case where a pad region and a disposition region of an electrostatic protection circuit are square.

FIG. 3 illustrates an example of the size in a case where the pad region and the disposition region of the electrostatic protection circuit are square. PAD represents each of the pad regions PAD1 to PAD4, and ESD represents each of the disposition regions ESD1 to ESD4 of the electrostatic protection circuit. As illustrated in FIG. 3, a length LPD of one side of the pad region PAD in which the pad is disposed in the circuit device 100 of a non-shrink version is longer than a length LES of one side of the disposition region ESD of the electrostatic protection circuit in which the pad is disposed in the circuit device 120 of a shrink version.

By doing so, the circuit device 100 of a non-shrink version can use a pad having an area wider than an area of the pad in the circuit device 120 of a shrink version. Thereby, reliability of bonding can be improved in the circuit device 100 of a non-shrink version. This point will be described with reference to FIG. 4.

Figure 4:
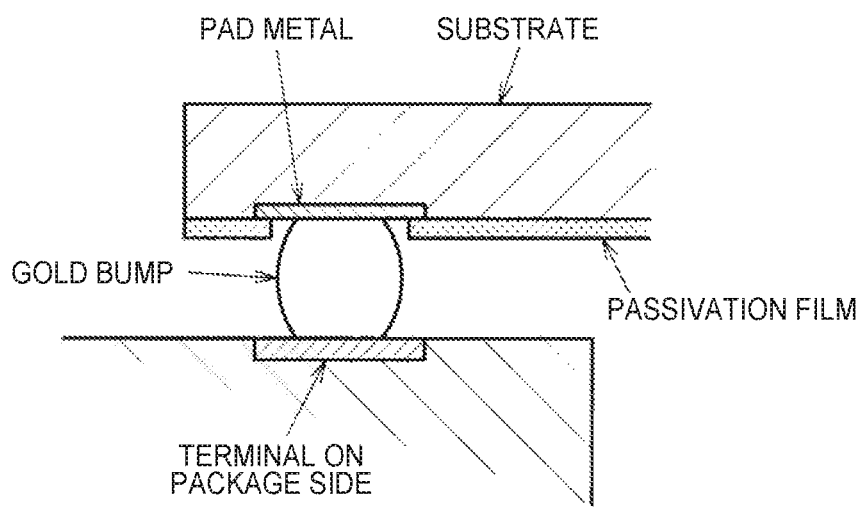
FIG. 4 is an example of a terminal connection when the circuit device is mounted on a package.

FIG. 4 illustrates an example of a terminal connection when the circuit device (100, 120) is mounted in a package. FIG. 4 illustrates an example of so-called flip chip mounting for mounting a bare chip (without passing through a lead terminal or the like in a state of being not packaged) as a semiconductor chip.

As illustrated in FIG. 4, a gold bump is interposed between the pad (pad metal exposed from a passivation film) of the circuit device and a terminal on a package side (terminal provided inside the package). The gold bump is crushed by pressing the pad and the terminal on a package side, and the pad and the terminal on a package side are connected by the gold bump. The gold bump is a bump (granules) formed of gold (Au).

In a case where the mounting is performed, there is a possibility that the crushed gold bump may damage the semiconductor chip. For example, there is a possibility that the passivation film is cracked. In addition, in a case where an area of the pad is narrow, there is a possibility that a connection fails (that is, a connection with a large contact resistance) at the time of mounting, or a connection fails afterward due to a stress applied to the semiconductor chip or the package after mounting. In this regard, according to the present embodiment, in a case where reliability of bonding is required, a non-shrink version layout having a large pad area can be adopted. Thereby, it is possible to reduce the possibility of damaging the semiconductor chip or the possibility of connection failure describe above. Meanwhile, in a case where reliability of bonding is not required as much as for in-vehicle use or the like, cost can be reduced by adopting the shrink version layout.

2. Detailed Layout Configuration Example of Circuit Device

Figure 5:
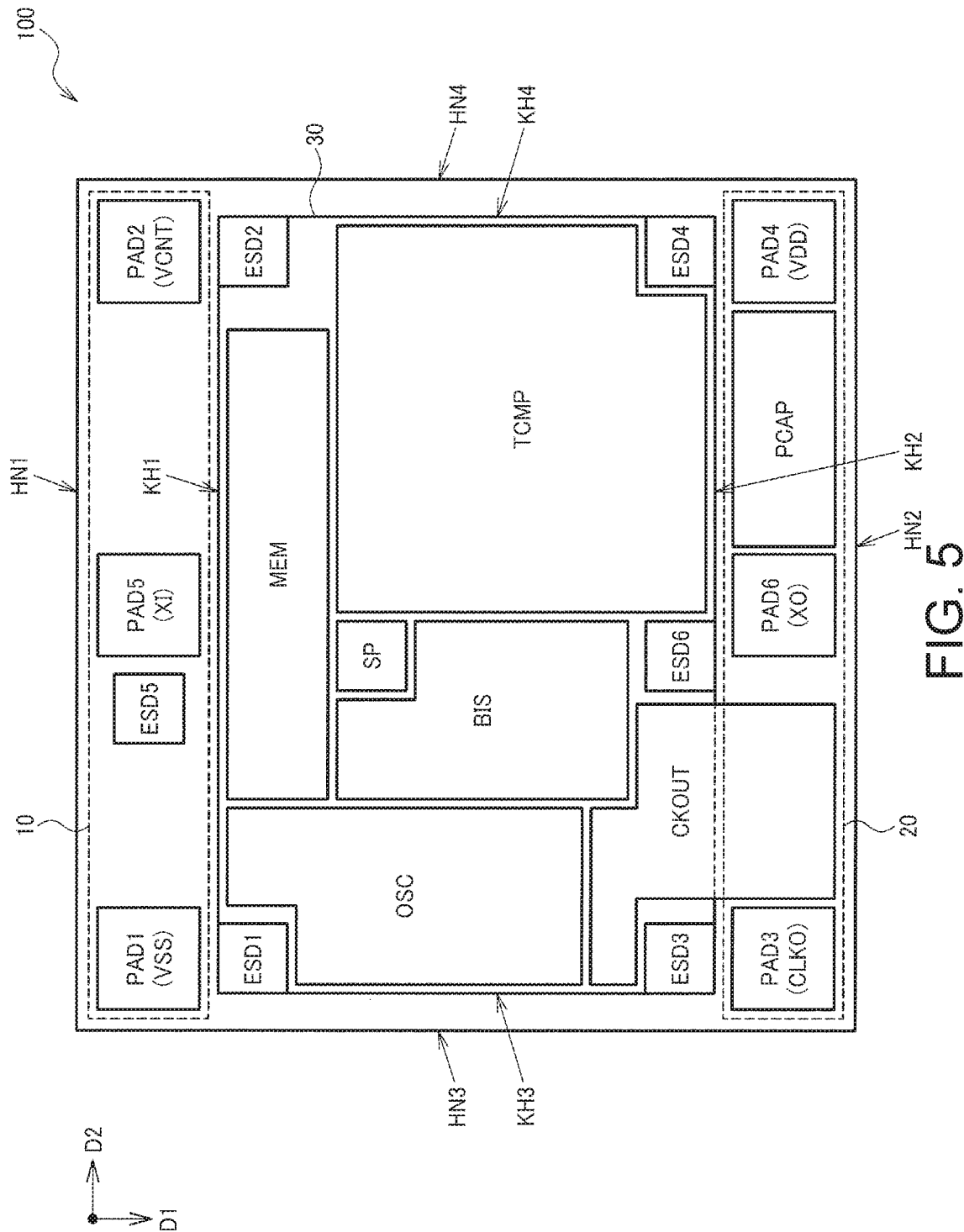
FIG. 5 is a detailed layout configuration example of the circuit device according to the present embodiment.

FIG. 5 is a detailed layout configuration example of the circuit device 100 according to the present embodiment. Hereinafter, a case where the circuit device 100 is a TCXO circuit device will be described as an example, but the invention is not limited to this, and the layout configuration example of FIG. 1 can be applied to various circuit devices. In addition, the present embodiment is not limited to the configuration of FIG. 5, and various modifications such as omitting a part of configuration elements thereof and adding other configuration elements can be made.

In the present embodiment, the circuit device 100 includes an oscillation circuit that oscillates an oscillation piece, a clock signal output circuit that outputs a clock signal based on an oscillation signal of the oscillation circuit, and a temperature compensation circuit that performs temperature compensation of an oscillation frequency of the oscillation circuit. The oscillation circuit, the clock signal output circuit, and the temperature compensation circuit are disposed in the circuit disposition region 30.

More specifically, the oscillation circuit is disposed in a region OSC, the clock signal output circuit is disposed in a region CKOUT, and the temperature compensation circuit is disposed in a region TCMP. The region OSC is in contact with the sides KH1 and KH3 of the circuit disposition region 30 and has an approximately rectangular (or approximately square) shape. The region CKOUT is disposed on a first direction D1 side of the region OSC, and is adjacent to the region OSC. The first direction D1 is a direction from the first side HN1 of the circuit device 100 toward the second side HN2. The region TCMP is in contact with the sides KH2 and KH4 of the circuit disposition region 30, has an approximately rectangular (or approximately square) region, and is disposed on a second direction D2 side of the regions OSC and CKOUT. The second direction D2 intersects (is orthogonal to) the first direction D1 and a direction from the third side HN3 toward the fourth side HN4 of the circuit device 100.

In addition, the circuit device 100 can include a nonvolatile memory for storing parameter information for temperature compensation of the oscillation frequency. In addition, the circuit device 100 can include a voltage generation circuit (bias circuit) which supplies power and a reference voltage to each part of the circuit device 100.

Specifically, the nonvolatile memory is disposed in a region MEM, and the voltage generation circuit is disposed in a region BIS. The region MEM is in contact with the side KH1 of the circuit disposition region 30 and has a rectangular (approximately rectangular) region whose long side is a side along the side KH1, and is adjacent to the region OSC and the region TCMP. The region BIS is disposed between the region OSC and the region TCMP, is surrounded by the region OSC, the region CKOUT, the region TCMP, and the region MEM, and has an approximately rectangular (or approximately square) region.

A part of the respective circuits (regions where the respective circuits are disposed) may be disposed in the first pad disposition region 10 or the second pad disposition region 20. In the example of FIG. 5, a part of the clock signal output circuit CKOUT is disposed in the second pad disposition region 20. A portion disposed outside the circuit disposition region 30 described above may be included in the circuit disposition region 30 or may be removed, when a circuit device of a shrink version is formed.

As described above, in the present embodiment, the circuit serving as a core of the TCXO is disposed in the circuit disposition region 30. As described with reference to FIG. 1, the electrostatic protection circuit connected to the pads disposed in the pad disposition region (10, 20) is provided in the circuit disposition region 30. Thereby, it is possible to produce a TCXO circuit device of a shrink version in a simple sequence by removing the pad disposition region so as to leave the circuit disposition region 30 and providing pads in the disposition region where the electrostatic protection circuit is disposed.

In addition, in the present embodiment, the first pad PAD1 receives a low potential side power supply. The second pad PAD2 receives a control voltage of an oscillation frequency. The third pad PAD3 receives a clock signal. The fourth pad PAD4 receives a high potential side power supply.

By disposing the pads in the first pad disposition region 10 and the second pad disposition region 20, power is supplied to and signals are input and output to and from the TCXO circuit device. By providing the pads in the disposition region of the electrostatic protection circuit, TCXO circuit device of a shrink version can be produced. That is, in the layout of a shrink version, the pad to which the low potential side power supply is supplied is disposed in the disposition region ESD1, the pad to which the control voltage of an oscillation frequency is input is disposed in the disposition region ESD2, the pad from which a clock signal is output is disposed in the disposition region ESD3, and the pad to which a high potential side power supply is supplied is disposed in the disposition region ESD4.

In addition, in the present embodiment, the circuit device 100 includes a fifth pad and a sixth pad. The fifth pad is disposed between the first pad PAD1 and the second pad PAD2 in the first pad disposition region 10. The sixth pad is disposed between the third pad PAD3 and the fourth pad PAD4 in the second pad disposition region 20. The fifth pad is connected to one terminal of an oscillation piece, and is disposed in a fifth pad region PAD5. The sixth pad is connected to the other terminal of the oscillation piece, and is disposed in a sixth pad region PAD6.

As the pads are disposed in the first pad disposition region 10 and the second pad disposition region 20, it is possible to connect an oscillation piece to the oscillation circuit OSC of the circuit device 100, and to oscillate the oscillation piece by using the oscillation circuit. An oscillator can be configured by housing the circuit device 100 and an oscillation piece in a package.

In addition, the present embodiment includes a fifth electrostatic protection circuit ESD5 connected to the fifth pad PAD5. The fifth electrostatic protection circuit is disposed in the first pad disposition region 10.

Specifically, the fifth electrostatic protection circuit is disposed in the disposition region ESD5 in the first pad disposition region 10. For example, the disposition region ESD5 is disposed so as to be adjacent to the pad region PAD5. Unlike the disposition regions ESD1 to ESD4, the pad need not be disposed in the disposition region ESD5. That is, the pads are not disposed in the layout of a shrink version. A disposition region SP is provided in the circuit disposition region 30. The disposition region SP has a size (size smaller than a size of the pad region PAD5) in which the pad can be disposed. That is, in the layout of a shrink version, the pad (fifth pad) connected to one terminal of an oscillation piece and a fifth electrostatic protection circuit connected to the pad are disposed in the disposition region SP. The disposition region SP is disposed on the first direction D1 side of the region MEM in which the nonvolatile memory is disposed. More specifically, the disposition region SP is surrounded by the region MEM in which a nonvolatile memory is disposed, the region BIS in which a voltage generation circuit is disposed, and the region TCMP in which a temperature compensation circuit is disposed.

The circuit device 100 further includes a sixth electrostatic protection circuit connected to the sixth pad. The sixth electrostatic protection circuit is disposed in a disposition region ESD6 in the circuit disposition region 30. The disposition region ESD6 has a size (size smaller than a size of the pad region PAD6) in which the pad can be disposed. That is, in the layout of a shrink version, a pad (sixth pad) connected to the other terminal of the oscillation piece is disposed in the disposition region ESD6. The disposition region ESD6 is disposed between the disposition region ESD3 and the disposition region ESD4. No circuit element is disposed between the disposition region ESD6 and the side KH2 of the circuit disposition region 30. That is, the disposition region ESD6 is disposed so as to be adjacent to the side KH2.

In addition, in the present embodiment, the nonvolatile memory MEM is disposed on the first direction D1 side of the fifth pad PAD5. Specifically, the nonvolatile memory is disposed so as to be adjacent to the first direction D1 side of the fifth pad.

In a case of the disposition, a fifth electrostatic protection circuit cannot be provided between the fifth pad and the nonvolatile memory (there is no space to be provided). Accordingly, in the layout of a shrink version, the fifth electrostatic protection circuit is disposed in the disposition region SP. However, in a case of a non-shrink version layout, the fifth pad and the disposition region SP are separated from each other by the nonvolatile memory interposed therebetween, and thereby, there is a possibility that an electrostatic protection function decreases. Hence, in the present embodiment, the fifth electrostatic protection circuit is disposed in the first pad disposition region 10 in the non-shrink version layout. Thereby, the electrostatic protection circuit functions properly. In addition, in the layout of the shrink version, an oscillation piece is connected to the pad disposed in the disposition region SP and the disposition region ESD6, a connection wire does not cross the nonvolatile memory which is a digital circuit. Thereby, it is possible to reduce an influence (for example, decrease of jitter characteristics) on an oscillation signal caused by the digital signal.

In addition, in the present embodiment, the oscillation circuit OSC is disposed in a region between the first electrostatic protection circuit ESD1 and the third electrostatic protection circuit ESD3.

An oscillation circuit that generates an AC signal (alternate current signal) can influence a temperature compensation circuit which operates in a DC (direct current) manner. For example, there is a possibility that accuracy of temperature compensation decreases and temperature characteristics of an oscillation frequency decrease (an error between a nominal frequency and an oscillation frequency increases). Accordingly, it is desirable that an oscillation circuit and a temperature compensation circuit are disposed at positions separated from each other in the circuit disposition region 30. In the present embodiment, a distance between the oscillation circuit and the temperature compensation circuit can be secured by disposing the oscillation circuit between the first and third electrostatic protection circuits disposed in corner regions of the circuit disposition region 30.

In addition, in the present embodiment, an inter-power supply capacitor (pass capacitor) which is provided between a high potential power supply and a low potential power supply is disposed in at least one region of the first pad disposition region 10 and the second pad disposition region 20.

Specifically, the inter-power supply capacitor is disposed in a region PCAP, and the region PCAP is disposed in at least one region of the first pad disposition region 10 and the second pad disposition region 20. The inter-power supply capacitor is disposed in a region between the pad and the pad. In FIG. 5, the inter-power supply capacitor is disposed in the second pad disposition region 20, the inter-power supply capacitor may be disposed in the first pad disposition region 10, or may be disposed in both the first pad disposition region 10 and the second pad disposition region 20. The inter-power supply capacitor is, for example, a metal insulator metal (MIM) capacitor in which an insulating layer is provided between two metal layers. The invention is not limited to this, and a MOS capacitor, a capacitor in which an insulating layer is provided between two polysilicon layers, or the like may be used as the inter-power supply capacitor.

As such, it is possible to effectively utilize an empty region (region between the pads) in the pad disposition region by disposing the inter-power supply capacitor in the pad disposition region. In addition, it is possible to reduce the influence of a connection resistance of the pad (terminal) or an inductance of the wire as much as possible by providing the inter-power supply capacitor in the semiconductor chip. Thereby, noise of the power supply supplied to each unit of the circuit device 100 is reduced, and the characteristics can be improved. For example, by reducing noise of the power supply of a temperature compensation circuit, performance of temperature compensation (performance of constantly compensating an oscillation frequency regardless of temperature) can be improved.

3. Detailed Configuration Example of Circuit Device

Figure 6:
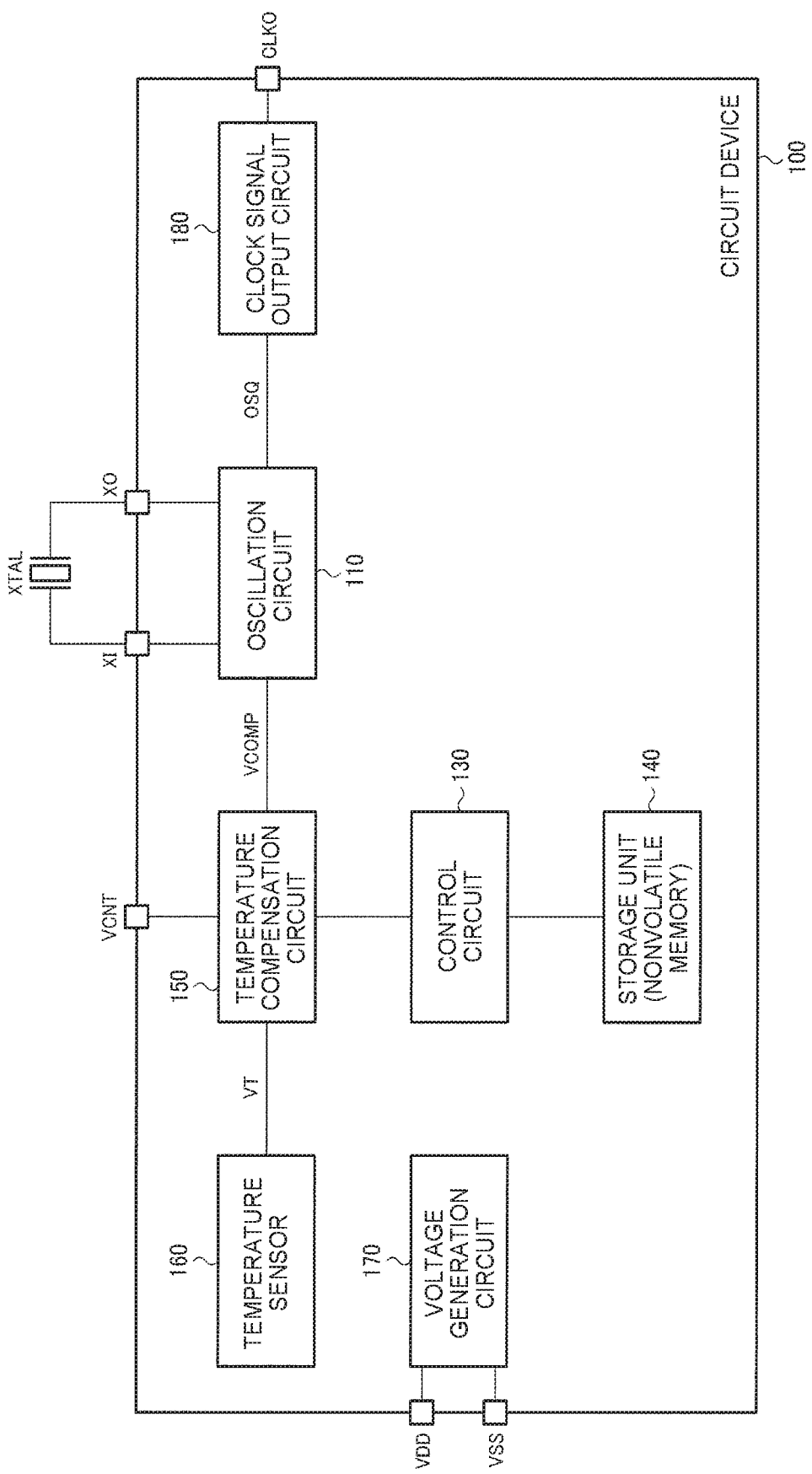
FIG. 6 is a block diagram of a detailed configuration example of the circuit device according to the present embodiment.

FIG. 6 is a block diagram of a detailed configuration example of the circuit device 100 according to the present embodiment. The circuit device 100 includes a temperature sensor 160, a temperature compensation circuit 150, a control circuit 130, a storage unit 140 (nonvolatile memory), an oscillation circuit 110, a clock signal output circuit 180, and a voltage generation circuit 170 (bias generation circuit). The configuration of the circuit device is not limited to the configuration of FIG. 6, and various modifications such as omitting a part of configuration elements (for example, the temperature sensor 160 and the like) thereof and adding other configuration elements can be made.

The oscillation circuit 110 generates an oscillation signal using an oscillation piece XTAL. Specifically, the oscillation circuit 110 is connected to the oscillation piece XTAL through a terminal XI and a terminal XO. The terminal XI corresponds to the fifth pad disposed in the pad region PAD5 in FIG. 5, and the terminal XO corresponds to the sixth pad disposed in the pad region PAD6 in FIG. 5. The oscillation circuit 110 generates an oscillation signal by oscillating the oscillation piece XTAL. For example, in TCXO and OCXO, a control voltage VCOMP (voltage for temperature compensation, voltage for compensating temperature characteristics of an oscillation frequency) according to the detected temperature is input to the oscillation circuit 110, and the oscillation circuit 110 oscillates the oscillation piece XTAL at an oscillation frequency corresponding to the control voltage VCOMP.

The oscillation piece XTAL is a piezoelectric vibration piece such as a quartz crystal vibration piece. The oscillation piece XTAL may be an oven type vibration piece provided in a constant temperature oven. Alternatively, the oscillation piece XTAL may be a resonator (an electromechanical resonance piece or an electrical resonance circuit). A piezoelectric vibration piece, a surface acoustic wave (SAW) resonance piece, a micro electromechanical systems (MEMS) vibration piece, or the like can be adopted as the oscillation piece XTAL. Piezoelectric single crystal such as quartz crystal, lithium tantalate, or lithium niobate, a piezoelectric material such as piezoelectric ceramic such as lead zirconate titanate, a silicon semiconductor material, or the like can be used as a substrate material of the oscillation piece XTAL. A material having piezoelectric effects or a material which performs an electrostatic drive using Coulomb force may be used as means for exciting the oscillation piece XTAL.

The clock signal output circuit 180 outputs a clock signal to a terminal CLKO on the basis of an output signal OSQ of the oscillation circuit 110. The terminal CLKO corresponds to the third pad disposed in the pad region PAD3 of FIG. 5. The clock signal output circuit 180 buffers (amplifies for driving an external load) the output signal OSQ or a signal obtained by dividing the output signal OSQ, and outputs the buffered signal as the clock signal.

The control circuit 130 controls each unit of the circuit device 100. In addition, the control circuit 130 also performs interface processing with an external device (for example, a CPU or the like) of the circuit device 100. The control circuit 130 is realized by a logic circuit such as a gate array. The control circuit 130 is disposed, for example, in the region MEM or the region TCMP in FIG. 5.

The storage unit 140 stores various kinds of information necessary for an operation of the circuit device 100. For example, the storage unit stores information (coefficient of polynomial for temperature compensation) and the like necessary for the temperature compensation circuit 150 to perform temperature compensation processing. The information is written to the storage unit from an external device (for example, a test device), when the circuit device 100 is manufactured or when an oscillator in which the circuit device 100 and the oscillation piece XTAL are packaged is manufactured. The storage unit 140 is, for example, a nonvolatile memory (for example, a floating gate avalanche injection MOS (FAMOS) type, a metal oxide nitride oxide silicon (MONOS) type, or the like).

The temperature compensation circuit 150 generates a control voltage VCOMP (temperature compensation voltage) for realizing temperature compensation of an oscillation frequency of the oscillation circuit 110, and outputs the control voltage VCOMP to the oscillation circuit 110, based on a temperature detection signal VT (temperature detection voltage) from the temperature sensor 160. For example, the temperature compensation circuit measures temperature characteristics of the oscillation frequency of the oscillation piece XTAL by using a test device, and obtains a third-order or fifth-order polynomial (approximate equation) for cancelling (suppressing variation of the oscillation frequency due to the temperature characteristics) the temperature characteristics. Coefficients of the polynomial are written to the storage unit 140. When the temperature compensation circuit 150 performs temperature compensation, the control circuit 130 reads the polynomial coefficients from the storage unit 140 and outputs the coefficients to the temperature compensation circuit 150. Based on the coefficients, the temperature compensation circuit 150 generates the control voltage VCOMP for cancelling (suppressing variation of the oscillation frequency due to the temperature characteristics) the temperature characteristics of the oscillation frequency. In addition, the temperature compensation circuit 150 outputs the control voltage VCOMP on the basis of the control voltage of the oscillation frequency externally input through a terminal VCNT. For example, the control voltage for temperature compensation generated on the basis of the temperature detection signal VT is added to the control voltage input from the outside through the terminal VCNT, and the added voltage is output as the control voltage VCOMP. The terminal VCNT corresponds to the second pad disposed in the pad region PAD2 in FIG. 5.

The temperature sensor 160 detects temperature of the circuit device 100 (semiconductor chip). For example, the temperature sensor 160 can be configured by a diode (PN junction) and the like. In this case, temperature detection is performed by using temperature dependence of a forward voltage of the diode. That is, the temperature detection signal VT is output on the basis of the forward voltage of the diode. The temperature sensor 160 is not limited to this, and can adopt various temperature sensors such as a thermistor. For example, the temperature sensor 160 is disposed in the region BIS in FIG. 5.

The voltage generation circuit 170 generates a power supply, a reference voltage, a bias voltage, a bias current, and the like to be supplied to each unit of the circuit device 100. Specifically, the voltage generation circuit 170 receives a high potential side power supply through a terminal VDD, and receives a low potential side power supply (ground) through a terminal VSS. The terminal VDD corresponds to the fourth pad disposed in the pad region PAD4 in FIG. 5, and the terminal VSS corresponds to the first pad disposed in the pad region PAD1 in FIG. 5. For example, the voltage generation circuit 170 can include a band gap reference circuit that generates a voltage (voltage serving as a reference for the respective voltages to be generated) with very low temperature dependence, a regulator that generates a power supply, a reference voltage, or a bias voltage, a current generation circuit that generates a bias current, and the like.

4. Oscillation Circuit

Figure 7:
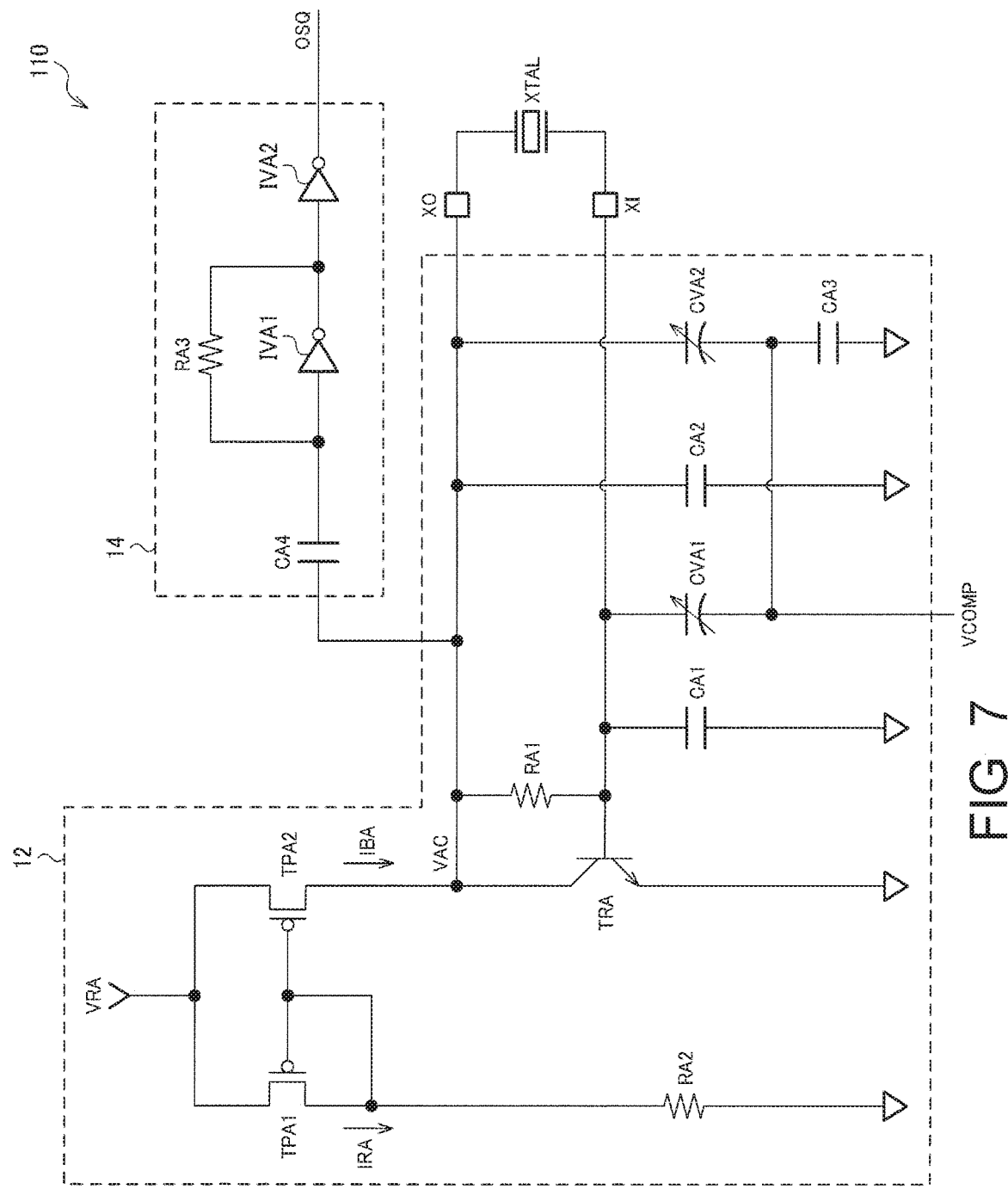
FIG. 7 is a detailed configuration example of an oscillation circuit.

FIG. 7 is a detailed configuration example of the oscillation circuit 110. The oscillation circuit 110 includes an oscillation unit 12 (oscillation circuit body) and a buffer (prebuffer, amplification unit). The present embodiment is not limited to the configuration of FIG. 7, and various modifications such as omitting apart of configuration elements thereof and adding other configuration elements can be made.

The oscillation unit 12 includes a current mirror circuit (current source) configured with transistors TPA1 and TPA2 (P-type transistor, first conductivity type transistor) and a resistance element RA2. The current mirror circuit mirrors a current IRA flowing through the resistance element RA2 and outputs a bias current IBA.

In addition, the oscillation unit 12 includes a bipolar transistor TRA, a resistance element RA1, capacitors CA1 to CA3, and varactors CVA1 and CVA2 (variable capacitance diode, variable capacitor). A collector terminal of the bipolar transistor TRA is connected to one terminal of the oscillation piece XTAL through the terminal XO (pad), and a base terminal is connected to the other terminal of the oscillation piece XTAL through the terminal XI (pad). A base-emitter current generated by oscillation of the oscillation piece XTAL flows through the bipolar transistor TRA. If the base-emitter current increases, a collector-emitter current increases, a bias current, which branches to the resistance element RA1, of the bias current IBA decreases, and thereby, a collector voltage VCA decreases. Meanwhile, if the base-emitter current decreases, the collector-emitter current decreases, the bias current, which branches to the resistance element RA1, of the bias current IBA increases, and thereby, the collector voltage VCA increases. Since the collector voltage VCA is fed back to the oscillation piece XTAL, the oscillation piece XTAL oscillates.

An oscillation frequency of the oscillation piece XTAL has temperature characteristics, and the temperature characteristics are compensated by the control voltage VCOMP generated by the temperature compensation circuit 150. That is, the control voltage VCOMP is input to one terminal of each of the varactors CVA1 and CVA2, and capacitance values of the varactors CVA1 and CVA2 are controlled by the control voltage VCOMP. The other terminals of the varactors CVA1 and CVA2 are connected to a base terminal and a collector terminal of the bipolar transistor TRA. If the capacitance values of the varactors CVA1 and CVA2 change, a resonance frequency of an oscillation loop changes, and thereby, variation of the oscillation frequency according to the temperature characteristics of the oscillation piece XTAL is compensated.

The oscillation circuit according to the present embodiment is not limited to the configuration of FIG. 7, and can adopt various oscillation circuits. In addition, although a case where variable capacitors are used for CVA1 and CVA2 is described as an example in FIG. 7, the present embodiment is not limited to this, and only one of CVA1 and CVA2 may be used as a variable capacitor controlled by the control voltage VCOMP.

The buffer 14 includes a capacitor CA4, a resistance element RA3, and inverters IVA1 and IVA2. A collector voltage VCA (oscillation signal) is input to the inverter IVA1 through the capacitor CA4. An output of the inverter IVA1 is fed back to the input through the resistance element RA3, and thereby a bias point of the input of the inverter IVA1 is controlled. The inverter IVA2 buffers an output of the inverter IVA1 and outputs the buffered signal as the output signal OSQ.

5. Clock Signal Output Circuit

Figure 8:
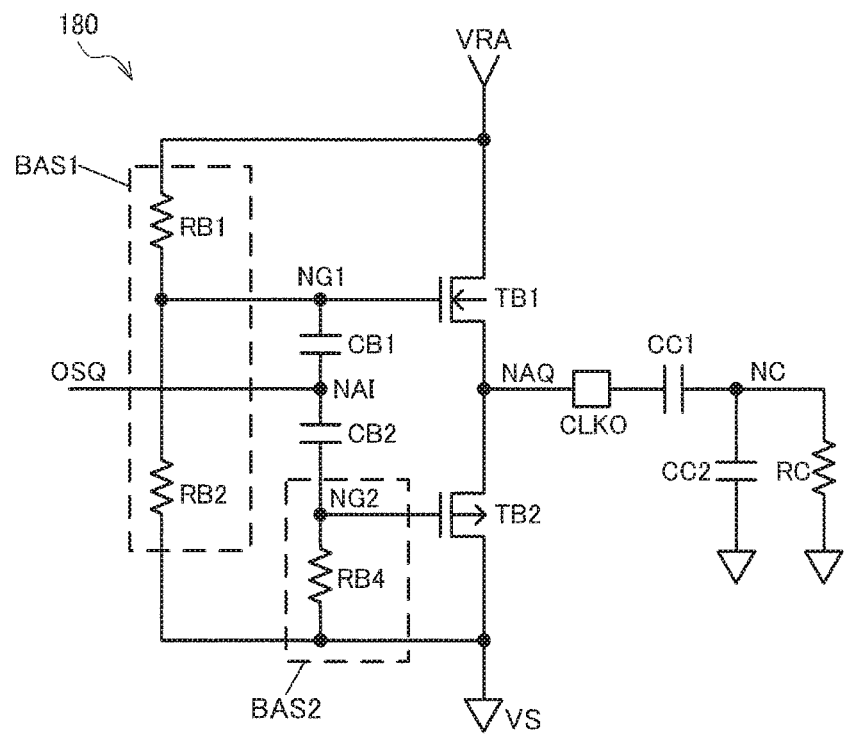
FIG. 8 is a detailed configuration example of a clock signal output circuit.

FIG. 8 is a detailed configuration example of the clock signal output circuit 180. The present embodiment is not limited to the configuration of FIG. 8, and various modifications such as omitting a part of constituent elements thereof and adding other configuration elements can be made. For example, in the following description, a case where the clock signal output circuit 180 outputs a clock signal of a clipped sine wave will be described as an example, and the invention is not limited to this. For example, the clock signal output circuit 180 may output a clock signal of a rectangular wave (for example, CMOS level).

The clock signal output circuit 180 in FIG. 8 includes transistors TB1 and TB2, bias voltage setting circuits BAS1 and BAS2, and capacitors CB1 and CB2.

The transistor TB1 is provided between a node (high potential side power supply node) of a power supply VRA and an output node NAQ. The transistor TB2 is provided between the output node NAQ and a node of power supply VS (low potential side power supply node). For example, the transistor TB1 is an N-type transistor (first conductivity type transistor), and the transistor TB2 is a P-type transistor.

The bias voltage setting circuit BAS1 sets a bias voltage to a gate node NG1 of the transistor TB1. The bias voltage setting circuit BAS1 includes, for example, resistance elements RB1 and RB2 provided in series between the node of the power supply VRA and the node of the power supply VS. Thereby, a voltage obtained by dividing the power supplies VRA and VS using resistance elements RB1 and RB2 provided therebetween is applied to the gate node NG1 as a bias voltage.

The bias voltage setting circuit BAS2 sets a bias voltage to a gate node NG2 of the transistor TB2. The bias voltage setting circuit BAS2 includes, for example, a resistance element RB4 provided between a gate node NG2 and the node of the power supply VS.

A capacitor CB1 is provided between an input node NAI to which an output signal OSQ is input from the buffer 14 of the oscillation circuit 110 and the gate node NG1. A capacitor CB2 is provided between the input node NAI and the gate node NG2. The capacitors CB1 and CB2 are used for DC cutting (for AC coupling).

A capacitor CC1 is provided between the terminal CLKO and an external node NC. A resistance element RC and a capacitor CC2 which are connected to the node NC are external loads.

If a voltage of the node NAI changes, a voltage of the node NG1 changes with respect to a bias voltage generated by the bias voltage setting circuit BAS 1. In addition, a voltage of the node NG2 changes with respect to a bias voltage generated by the bias voltage setting circuit BAS2. That is, gate voltages of the transistors TB1 and TB2 change with respect to the bias voltage, and thereby, drive capability (ON resistance) of the transistors TB1 and TB2 is controlled. Thereby, a signal of a clipped sine wave is output to the output node NAQ. The signal of a clipped sine wave is obtained by clipping upper and lower sides of the sine wave to a predetermined voltage level (for example, power supply voltage level).

6. Temperature Compensation Circuit

Figure 9:
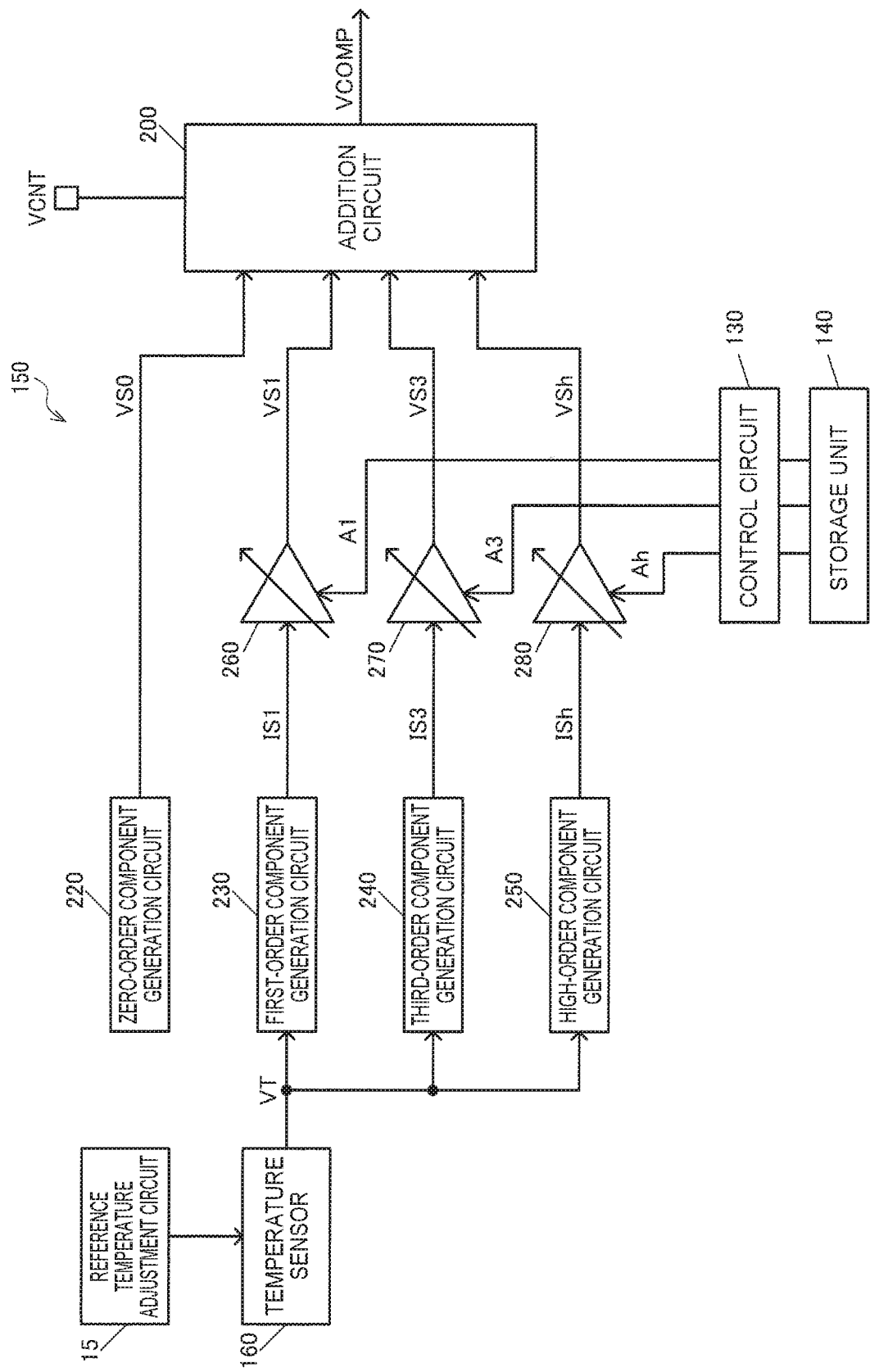
FIG. 9 is a detailed configuration example of a temperature compensation circuit.

FIG. 9 is a detailed configuration example of the temperature compensation circuit 150. The temperature compensation circuit 150 includes a reference temperature adjustment circuit 15, a zero-order component generation circuit 220, a first-order component generation circuit 230, a third-order component generation circuit 240, a high-order component generation circuit 250, a first-order component gain adjustment circuit 260, a third-order component gain adjustment circuit 270, a high-order component gain adjustment circuit 280, and an addition circuit 200. The present embodiment is not limited to the configuration of FIG. 9, and various modifications such as omitting apart of configuration elements thereof and adding other configuration elements can be made.

The reference temperature adjustment circuit 15 adjusts a reference temperature T0 of a control voltage VCOMP (temperature compensation voltage), and adjusts the reference temperature T0 by adjusting, for example, a reference voltage of a temperature detection signal VT (temperature detection voltage). Each of first-order components, third-order components, and high-order components of the control voltage VCOMP is symmetrical with respect to the reference temperature T0, and the reference temperature adjustment circuit 15 adjusts the center of the symmetry.

The zero-order component generation circuit 220 outputs a zero-order component voltage VS0 (zero-order component signal) which approximates zero-order components of temperature characteristics of an oscillation frequency of the oscillation piece XTAL (quartz crystal vibration piece). For example, the zero-order component generation circuit is configured with a circuit which outputs a DC voltage such as a resistor dividing circuit.

The first-order component generation circuit 230 outputs a first-order component current IS1 (first-order component signal in a broad sense) that approximates first-order components of temperature characteristics of an oscillation frequency of a quartz crystal vibration piece. That is, if temperature is referred to as T, IS1 is a current approximating a function proportional to or inversely proportional to $(T-T0)$. The first-order component generation circuit 230 can be configured by, for example, a normal amplifier and the like. The first-order component gain adjustment circuit 260 adjusts a gain of the first-order component current IS1 on the basis of a gain value A1 stored in the storage unit 140, and outputs a first-order component voltage VS1=A1×IS1 (first-order output signal in a broad sense). The first-order component generation circuit 230 and the first-order component gain adjustment circuit 260 may be configured as an integral amplification circuit (for example, a normal amplifier) that can adjust a gain.

The third-order component generation circuit 240 outputs a third-order component current IS3 (third-order component signal in a broad sense) that approximates third-order components of temperature characteristics of an oscillation frequency of a quartz crystal vibration piece. That is, IS3 is a current approximating a function proportional or inversely proportional to $(T-T0)^3$. The third-order component gain adjustment circuit 270 adjusts a gain of the third-order component current IS3 on the basis of a gain value A3 stored in the storage unit 140, and outputs a third-order component voltage VS3=A3×IS3 (third-order output signal in a broad sense).

The high-order component generation circuit 250 outputs a high-order component current ISh (high-order component signal in abroad sense) that approximates high-order components that are fourth-order or higher components of temperature characteristics of an oscillation frequency of a quartz crystal vibration piece. That is, ISh is a current approximating a higher-order function g $(T-T0)$. For example, g $(T-T0)$ is a composite function obtained by combining a function proportional or inversely proportional to $(T-T0)^4$ and a function proportional or inversely proportional to $(T-T0)^5$. The high-order component gain adjustment circuit 280 adjusts a gain of the high-order component current ISh on the basis of a gain value Ah stored in the storage unit 140, and outputs a high-order component voltage VSh=Ah×ISh (a high-order output signal in a broad sense).

The addition circuit 200 adds a zero-order component voltage VS0, a first-order component voltage VS1, a third-order component voltage VS3, a high-order component voltage VSh, and a control voltage input from the outside through the terminal VCNT, and outputs the control voltage VCOMP. If VS0=A0, the control voltage VCOMP approximates VCOMP=Ah×g $(T-T0)$+A3 $(T-T0)^3$+A1$(T-T0)$+A0.

In the configuration example of FIG. 9, a case where the current IS1 is output as the first-order component signal, the current IS3 is output as the third-order component signal, and the current ISh is output as the high-order component signal is described as an example, and the present embodiment is not limited to this. That is, voltages may be configured so as to be output as a first-order component signal, a third-order component signal, and a high-order component signal.

7. Oscillator, Electronic Apparatus, and Moving Object

Figure 10:
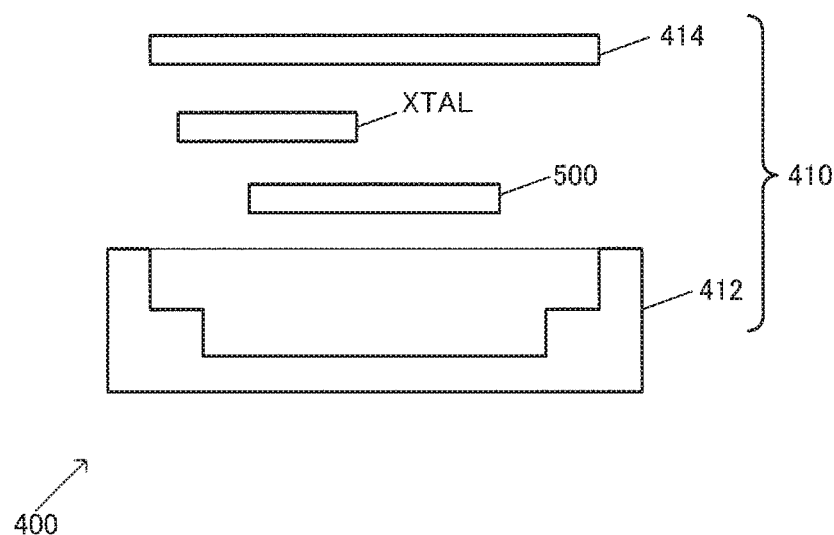
FIG. 10 is a configuration example of an oscillator.

FIG. 10 illustrates a configuration example of an oscillator 400 including a circuit device 500 according to the present embodiment. The oscillator 400 includes a circuit device 500 and the oscillation piece XTAL (vibration piece, vibration element). The circuit device 500 corresponds to the circuit device 100 or the circuit device 120 described above. In addition, the oscillator 400 can include the circuit device 100 and a package 410 in which the oscillation piece XTAL is housed. The oscillator is not limited to the configuration of FIG. 10, and various modifications such as omitting a part of configuration elements thereof and adding other configuration elements can be made.

The package 410 is configured by, for example, a base portion 412 and a lid portion 414. The base portion 412 is a member of, for example, a box shape or the like formed of an insulating material such as ceramic, and the lid portion 414 is a member of, for example, a flat plate or the like which is connected to the base portion 412. An external connection terminal (external electrode) for being connected to an external apparatus is provided on, for example, a bottom surface of the base portion 412. The circuit device 500 and the oscillation piece XTAL are housed in an internal space (cavity) formed by the base portion 412 and the lid portion 414. The circuit device 500 and the oscillation piece XTAL are enclosed with the lid portion 414 thereby being hermetically sealed in the package 410.

The circuit device 500 and the oscillation piece XTAL are mounted in the package 410. A terminal of the oscillation piece XTAL and a terminal (pad) of the circuit device 500 (IC) are electrically connected to each other by an internal wire of the package 410.

Figure 11:
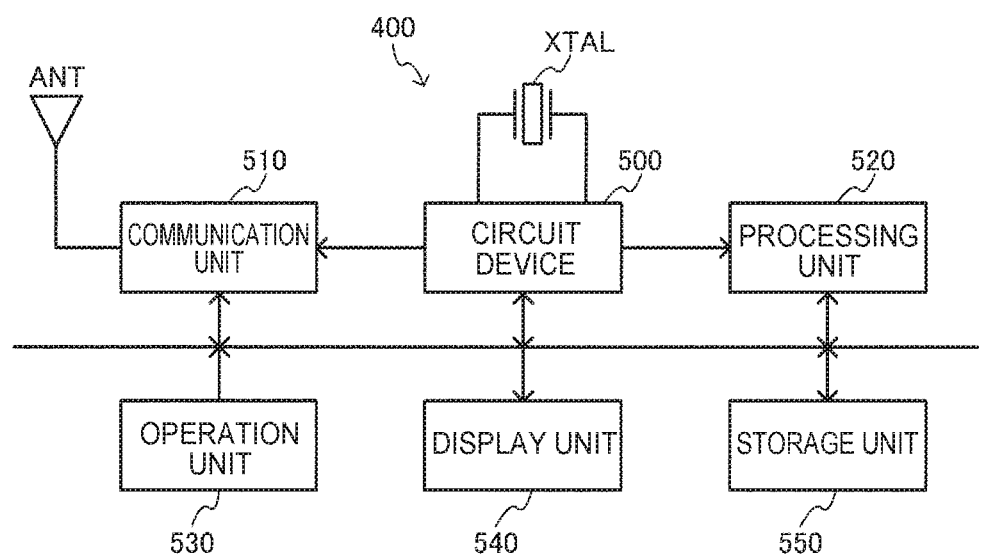
FIG. 11 is a configuration example of an electronic apparatus.

FIG. 11 illustrates a configuration example of an electronic apparatus including the circuit device 500 according to the present embodiment. The electronic apparatus can include the circuit device 500, the oscillation piece XTAL such as a quartz crystal vibration piece, an antenna ANT, a communication unit 510 (communication device), and a processing unit 520 (processing device). In addition, the electronic apparatus can include an operation unit 530 (operation device), a display unit 540 (display device), and a storage unit 550 (memory). The oscillator 400 is configured with the oscillation piece XTAL and the circuit device 500. The electronic apparatus is not limited to the configuration of FIG. 11, and various modifications such as omitting a part of the configuration elements and adding other configuration elements can be made.

The electronic apparatus in FIG. 11 includes various apparatuses, for example, a wearable apparatus such as a GPS built-in timepiece, a biological information measurement device (a pulse wave meter, a pedometer, or the like) or a head mounted display device, a portable information terminal (mobile terminal) such as a smartphone, a mobile phone, a portable game device, a notebook PC or a tablet PC, a content providing terminal that distributes contents, a video device such as a digital camera or a video camera, or a network-related device such as a base station or a router.

The communication unit 510 (wireless circuit) receives data from the outside through the antenna ANT and transmits the data to the outside. The processing unit 520 performs control processing of the electronic apparatus, various digital processing of data transmitted and received through the communication unit 510, or the like. A function of the processing unit 520 can be realized by a processor such as a microcontroller. The operation unit 530 is for a user to perform an input operation, and can be realized by an operation button, a touch panel display, or the like. The display unit 540 displays various kinds of information and can be realized by a display such as liquid crystal or organic EL. In a case where a touch panel display is used as the operation unit 530, the touch panel display also functions as both the operation unit 530 and the display unit 540. The storage unit 550 stores data, and a function thereof can be realized by a semiconductor memory such as a RAM or a ROM, a hard disk drive (HDD), or the like.

Figure 12:
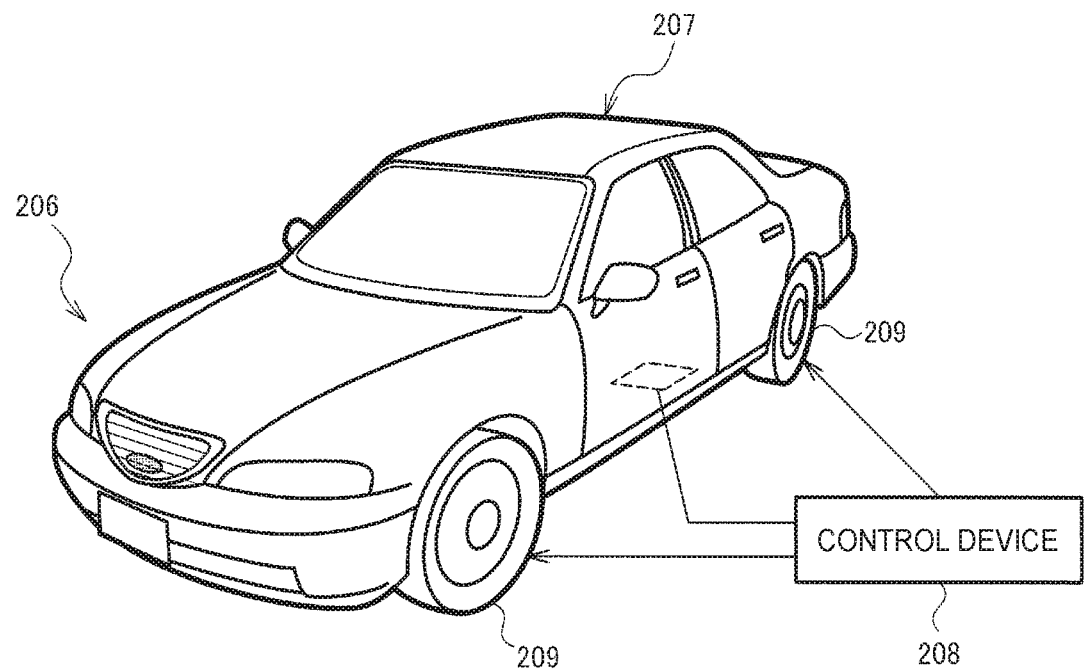
FIG. 12 is an example of a moving object.

FIG. 12 illustrates an example of a moving object including a circuit device according to the present embodiment. The circuit device (oscillator) according to the present embodiment can be incorporated into various moving objects such as a car, an airplane, a motorbike, a bicycle, a ship, or the like. The moving object includes, for example, a drive mechanism such as an engine or a motor, a steering mechanism such as a steering wheel or a rudder, and various electronic apparatuses (in-vehicle apparatus), and is an apparatus/device that moves on the ground, the sky, or the sea. FIG. 12 schematically illustrates a vehicle 206 as a specific example of the moving object. An oscillator (not illustrated) having the circuit device and the vibration piece according to the present embodiment is incorporated in the vehicle 206. A control device 208 operates in response to a clock signal generated by the oscillator. For example, the control device 208 controls hardness of a suspension in accordance with a posture of a vehicle body 207, or controls brakes of each wheel 209. For example, an automatic operation of the vehicle 206 may be realized by the control device 208. An apparatus in which the circuit device or the oscillator according to the present embodiment is incorporated is not limited to the control device 208, and can be incorporated into various apparatuses (in-vehicle apparatuses) provided in a moving object such as the vehicle 206.

The present embodiment is described in detail as above, and it can be readily understood by those skilled in the art that various modifications can be made without practically departing from the novel matters and effects of the invention. Hence, all the modifications are included in the scope of the invention. For example, words described together with another words which are broader or equivalent to at least once in the specification or the drawings, can be replaced with words different therefrom in any part of the specification or the drawings. In addition, all combinations of the present embodiment and modifications are included in the scope of the invention. In addition, the configurations, the operations, and the like of the circuit device, the oscillator, the electronic apparatus, the moving object, and the like are not limited to the description of the present embodiment, and various modifications can be made.

The entire disclosure of Japanese Patent Application No. 2016-201489, filed Oct. 13, 2016 is expressly incorporated by reference herein.

What is claimed is:

1. A circuit device comprising:
   a first pad and a second pad disposed in a first pad disposition region along a first side, the first pad disposition region being a rectangular pad region having a smallest rectangular boundary encompassing the first pad and the second pad;
   a third pad and a fourth pad disposed in a second pad disposition region along a second side of the circuit device which faces the first side, the second pad disposition region being a rectangular pad region having a smallest rectangular boundary encompassing the third pad and the fourth pad;
   a first electrostatic protection circuit disposed in a first circuit disposition region and connected to the first pad, the first circuit disposition region being a rectangular region having a smallest rectangular boundary encompassing the first electrostatic protection circuit;
   a second electrostatic protection circuit disposed in a second circuit disposition region and connected to the second pad, the second circuit disposition region being a rectangular region having a smallest rectangular boundary encompassing the second electrostatic protection circuit;
   a third electrostatic protection circuit disposed in a third circuit disposition region and connected to the third pad, the third circuit disposition region being a rectangular region having a smallest rectangular boundary encompassing the third electrostatic protection circuit; and a fourth electrostatic protection circuit disposed in a fourth circuit disposition region and connected to the fourth pad, the fourth circuit disposition region being a rectangular region having a smallest rectangular boundary encompassing the fourth electrostatic protection circuit, wherein the first electrostatic protection circuit and the second electrostatic protection circuit are arranged along the first pad disposition region, the third electrostatic protection circuit and the fourth electrostatic protection circuit are arranged along the second pad disposition region, a distance between the first pad and the first electrostatic protection circuit is less than any distance between the first pad and any of the second electrostatic protection circuit, the third electrostatic protection circuit, and the fourth electrostatic protection circuit, a distance between the second pad and the second electrostatic protection circuit is less than any distance between the second pad and any of the first electrostatic protection circuit, the third electrostatic protection circuit, and the fourth electrostatic protection circuit, a distance between the third pad and the third electrostatic protection circuit is less than any distance between the third pad and any of the first electrostatic protection circuit, the second electrostatic protection circuit, and the fourth electrostatic protection circuit, a distance between the fourth pad and the fourth electrostatic protection circuit is less than any distance between the fourth pad and any of the first electrostatic protection circuit, the second electrostatic protection circuit, and the third electrostatic protection circuit, the first circuit disposition region and the second circuit disposition region overlap the first pad disposition region in a plan view, and the third circuit disposition region and the fourth circuit disposition region overlap the second pad disposition region in the plan view.

2. The circuit device according to claim 1,
wherein a third side of the circuit device intersects the first side and the second side, and a fourth side of the circuit device faces the third side,
wherein the first pad is disposed in a first corner region where the first side intersects the third side,
wherein the second pad is disposed in a second corner region where the first side intersects the fourth side,
wherein the third pad is disposed in a third corner region where the second side intersects the third side, and
wherein the fourth pad is disposed in a fourth corner region where the second side intersects the fourth side.

3. An oscillator comprising:
the circuit device according to claim 2; and
an oscillation piece.

4. An electronic apparatus comprising:
the circuit device according to claim 2.

5. A moving object comprising:
the circuit device according to claim 2.

6. The circuit device according to claim 1,
wherein the first pad and the first electrostatic protection circuit are disposed so as to interpose a first boundary between the first pad disposition region and at least one of the first circuit disposition region, second circuit disposition region, third disposition region, and fourth disposition region, wherein the second pad and the second electrostatic protection circuit are disposed so as to interpose the first boundary,
wherein the third pad and the third electrostatic protection circuit are disposed so as to interpose a second boundary between the second pad disposition region and at least one of the first circuit disposition region, second circuit disposition region, third disposition region, and fourth disposition region, and
wherein the fourth pad and the fourth electrostatic protection circuit are disposed so as to interpose the second boundary.

7. An oscillator comprising:
the circuit device according to claim 6; and
an oscillation piece.

8. The circuit device according to claim 1, further comprising:
an oscillation circuit that oscillates an oscillation piece;
a clock signal output circuit that outputs a clock signal on the basis of an oscillation signal of the oscillation circuit; and
a temperature compensation circuit that performs temperature compensation of an oscillation frequency of the oscillation circuit,
wherein the oscillation circuit, the clock signal output circuit, and the temperature compensation circuit are disposed in at least one of the first circuit disposition region, second circuit disposition region, third disposition region, and fourth disposition region.

9. The circuit device according to claim 8,
wherein the first pad receives a low potential side power supply,
wherein the second pad receives a control voltage of the oscillation frequency,
wherein the third pad outputs the clock signal, and
wherein the fourth pad receives a high potential side power supply.

10. The circuit device according to claim 8, wherein the oscillation circuit is disposed in a region between the first electrostatic protection circuit and the third electrostatic protection circuit.

11. The circuit device according to claim 1,
wherein the first to fourth pads are disposed in corner regions of the circuit device, and
wherein the first to fourth electrostatic protection circuits are disposed in corner regions of the at least one of the first circuit disposition region, second circuit disposition region, third disposition region, and fourth disposition region.

12. An oscillator comprising:
the circuit device according to claim 1; and
an oscillation piece.

13. An electronic apparatus comprising:
the circuit device according to claim 1.

14. A moving object comprising:
the circuit device according to claim 1.

15. The circuit device according to claim 1,
wherein the first pad electrically connects the first electrostatic protection circuit to a first of a plurality of circuits or terminals outside the circuit device,
the second pad electrically connects the second electrostatic protection circuit to a second of the plurality of circuits or terminals outside the circuit device,
the third pad electrically connects the third electrostatic protection circuit to a third of the plurality of circuits or terminals outside the circuit device, and the fourth pad electrically connects the fourth electrostatic protection circuit to a fourth of the plurality of circuits or terminals outside the circuit device.

16. The circuit device according to claim 1, wherein the first circuit disposition region overlaps the first pad, the second circuit disposition region overlaps the second pad, the third circuit disposition region overlap the third pad, and the fourth circuit disposition region overlaps the fourth pad in the plan view.

* * * * *